US012228595B2

(12) United States Patent
Joos et al.

(10) Patent No.: US 12,228,595 B2
(45) Date of Patent: Feb. 18, 2025

(54) APPARATUS AND METHOD FOR MEASURING A CURRENT FLOWING THROUGH A PWM-CONTROLLED INDUCTIVE LOAD

(71) Applicant: Conti Temic microelectronic GmbH, Nuremberg (DE)

(72) Inventors: Ulrich Joos, Nonnenhorn (DE); Erwin Kessler, Bad Saulgau (DE)

(73) Assignee: Conti Temic microelectronic GmbH, Nuremberg (DE)

( * ) Notice: Subject to any disclaimer, the term of this patent is extended or adjusted under 35 U.S.C. 154(b) by 521 days.

(21) Appl. No.: 17/627,301

(22) PCT Filed: Jul. 14, 2020

(86) PCT No.: PCT/EP2020/069818
§ 371 (c)(1),
(2) Date: Jan. 14, 2022

(87) PCT Pub. No.: WO2021/009147
PCT Pub. Date: Jan. 21, 2021

(65) Prior Publication Data
US 2022/0260615 A1 Aug. 18, 2022

(30) Foreign Application Priority Data
Jul. 17, 2019 (DE) ............... 10 2019 210 566.1

(51) Int. Cl.
*G01R 19/165* (2006.01)
*G01K 13/00* (2021.01)
(Continued)

(52) U.S. Cl.
CPC ....... *G01R 19/16571* (2013.01); *G01K 13/00* (2013.01); *G01R 19/10* (2013.01);
(Continued)

(58) Field of Classification Search
CPC ............... G01R 19/0092; G01R 19/10; G01R 19/16571
See application file for complete search history.

(56) References Cited

U.S. PATENT DOCUMENTS

| 5,939,863 A | 8/1999 | Miller |
| 6,335,600 B1 | 1/2002 | Kasai et al. |
(Continued)

FOREIGN PATENT DOCUMENTS

| CN | 1287930 A | 3/2001 |
| CN | 101334430 A | 12/2008 |
(Continued)

OTHER PUBLICATIONS

Office Action dated Jun. 14, 2023 from corresponding Chinese patent application No. 202080051530.2.
(Continued)

*Primary Examiner* — Huy Q Phan
*Assistant Examiner* — Temilade S Rhodes-Vivour

(57) ABSTRACT

Disclosed are apparatus and method for measuring electric current flowing through an inductive load energized by a half-bridge circuit with at least two semiconductor switches. The semiconductor switches are switched on and off in a complementary manner according to PWM. The apparatus comprises: a monitoring device determining the switched-on states and switched-off states of at least one of the at least two semiconductor switches; a synchronous measurement amplifier controlled by the monitoring device measuring voltage drop at the semiconductor switch during the switched-on state of the semiconductor switch and multiplying it to form multiplied voltage; and a synchronous voltage follower controlled by the monitoring device generating a voltage signal characteristic of the current in the inductive load, which in the switched-on state of the semiconductor switch follows the multiplied voltage and in the
(Continued)

Figure 1:
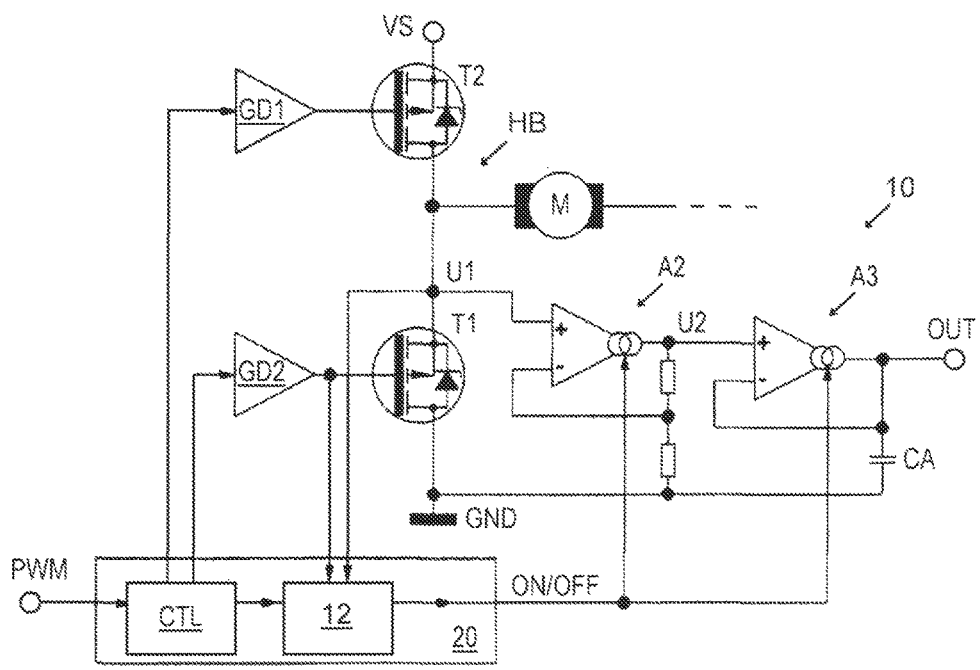

switched-off state of the semiconductor switch remains substantially constant or decreases according to a predefined profile.

15 Claims, 2 Drawing Sheets

(51) Int. Cl.
    *G01R 19/10*     (2006.01)
    *H02M 1/00*     (2007.01)
    *H02M 3/158*     (2006.01)
    *H02P 7/03*     (2016.01)

(52) U.S. Cl.
    CPC ......... *H02M 1/0009* (2021.05); *H02M 3/158* (2013.01); *H02P 7/04* (2016.02)

(56) References Cited

U.S. PATENT DOCUMENTS

| | | | |
|---|---|---|---|
| 7,045,993 | B1 | 5/2006 | Tomiyoshi |
| 7,372,238 | B1 | 5/2008 | Tomiyoshi |
| 9,812,979 | B1* | 11/2017 | Tschirhart ......... H02M 3/33592 |
| 9,853,548 | B1 | 12/2017 | Zhang |
| 10,181,811 | B2* | 1/2019 | Green ..................... H02P 9/48 |
| 2007/0176626 | A1 | 8/2007 | Bayerer et al. |
| 2012/0049772 | A1* | 3/2012 | Moussaoui ......... H02M 3/1588 318/376 |
| 2014/0070727 | A1 | 3/2014 | Pflaum |
| 2016/0111958 | A1 | 4/2016 | Choi et al. |
| 2016/0329808 | A1* | 11/2016 | Han ..................... H02M 1/08 |
| 2017/0302151 | A1* | 10/2017 | Snook ................. H03K 17/063 |
| 2018/0034358 | A1* | 2/2018 | Geske ................. H03K 17/168 |
| 2019/0036522 | A1 | 1/2019 | Ohashi |
| 2019/0162759 | A1 | 5/2019 | Poletto et al. |

FOREIGN PATENT DOCUMENTS

| | | |
|---|---|---|
| CN | 103674285 A | 3/2014 |
| CN | 103687184 A | 3/2014 |
| DE | 4338714 A1 | 5/1995 |
| DE | 19803040 A1 | 8/1998 |
| DE | 102006001874 A1 | 7/2007 |
| EP | 3185020 A1 | 6/2017 |
| EP | 3188351 A1 | 7/2017 |
| IN | 109075693 A | 12/2018 |
| JP | 2001078480 A | 3/2001 |
| JP | 2013150515 A | 8/2013 |
| JP | 2014003850 A | 1/2014 |
| JP | 2017121164 A | 7/2017 |
| JP | 2017534237 A | 11/2017 |
| WO | 2008075306 A1 | 6/2008 |

OTHER PUBLICATIONS

Office Action dated Apr. 2, 2020 from corresponding German patent application No. DE 10 2019 210 566.1.
Office Action dated Apr. 13, 2021 from corresponding German patent application No. DE 10 2019 210 566.1.
International Search Report and Written Opinion dated Oct. 12, 2020 from corresponding International Patent application No. PCT/EP2020/069818.
Notice of Reasons for Refusal dated Nov. 8, 2022 from corresponding Japanese patent application No. 2022-502596.
Notice of Reasons for Refusal dated Nov. 8, 2022 from corresponding Japanese patent application No. 2022-502596 (Translated).
Office Action dated Nov. 14, 2023 from corresponding Chinese patent application No. 202080051530.2.

\* cited by examiner

APPARATUS AND METHOD FOR MEASURING A CURRENT FLOWING THROUGH A PWM-CONTROLLED INDUCTIVE LOAD

The present invention relates to an apparatus for measuring an electric current flowing through an inductive load which is energized by means of a half-bridge circuit having at least two semiconductor switches, wherein the semiconductor switches are switched on and off in a complementary manner in accordance with a PWM (pulse-width modulation) method. The invention furthermore relates to a method for measuring such an electric current.

When operating inductive loads, such as electric motors, for example, using a PWM method, it is often necessary to measure the current presently flowing through the inductive load, that is to say for instance to generate a measurement signal that is characteristic of this current, which then in the case of motor operation can advantageously be used, for example, for regulation or control in the motor control or, for example, for determining an angular position of a rotor.

For example, the prior art discloses methods for this, in which the voltage drop at a measurement resistor arranged in series with the electric motor is measured and amplified so as to form a suitable measurement signal. A disadvantage of this method is that there is an additional voltage drop in the power branch, which reduces the efficiency of the system. In addition, this solution leads to additional costs and requires additional installation space for the measurement resistor.

Other methods known from the prior art use, for example, magnetic or magnetically coupled transformers. Such transmitters or transformers, however, also result in high additional costs and are also difficult to integrate or miniaturize.

The magnetic methods in the broadest sense also include the use of Hall sensors, using which the magnetic field strength caused by the current flowing through the inductive load is converted into a measurement signal (for example an analog voltage signal). A disadvantage is above all the limited accuracy and also the sensitivity of the arrangement of Hall sensors with respect to mechanical misalignment.

Furthermore, integrated circuits which are often referred to as "SmartDrivers" or which use what is known as "SenseFET" technology are known specifically for energizing electric motors. In this case, a certain part of a power transistor is separated and regulated in such a way that a current component that is proportional to the actual output current flows in said power transistor. This technology has the advantage that there is no additional voltage drop in the power circuit; however, a specific circuit breaker is required. These methods thus cannot be implemented with any semiconductor switch (for example any FETs, etc.). Further disadvantages are the high demands placed on the measurement amplifier and a limited accuracy of the measurement.

Furthermore, the prior art also describes methods that achieve a measurement of a current flowing through a switched-on circuit breaker by measuring the voltage drop at the circuit breaker. In DE 43 38 714 A1, for example, the current is measured in the switched-on state of a circuit breaker in order to determine a suitable switched-off state of the switch and thus to achieve regulation in a switched-mode power supply.

Furthermore, it is known, for example from WO 2008/075306 A1 relating to an audio amplifier, to use the voltage drop at a semiconductor switch to measure the current.

These known arrangements do not provide a continuous measurement signal, as is often desirable or, for example, is required by many digital control or regulation devices.

DE 198 03 040 A1 describes a method for measuring the current in a polarity-reversal protection switch in a power circuit. However, this switch itself is not clocked and the current can therefore be measured with little effort.

It is an object of the present invention to achieve a current measurement of the type mentioned at the beginning, that is to say the measurement of a current which is driven through an inductive load by means of a half-bridge circuit having a plurality of PWM-clocked semiconductor switches, wherein the measurement is intended to be able to be realized with few losses and comparatively low levels of effort with good accuracy at the same time.

In particular, the present invention aims to specify an apparatus and a method by means of which the current of the inductive load, in particular, for example, the current of an electric motor, can be measured in a pulse-width modulated circuit breaker of the half-bridge circuit and output as a continuous current measurement signal.

In accordance with a first aspect of the invention, this object is achieved by an apparatus as claimed in claim 1. The dependent claims relate to advantageous developments of the invention. The apparatus according to the invention has:
  a monitoring device, which is designed to determine the switched-on states and switched-off states of at least one of the at least two semiconductor switches,
  a synchronous measurement amplifier, which is controlled by the monitoring device and designed to measure a voltage drop present at the semiconductor switch during the determined switched-on state of the semiconductor switch and to multiply it so as to form a multiplied voltage, and
  a synchronous voltage follower, which is controlled by the monitoring device and generates a voltage signal which is characteristic of the current in the inductive load and which in the switched-on state of the semiconductor switch follows the multiplied voltage and in the switched-off state of the semiconductor switch remains substantially constant or decreases in accordance with a predefined profile.

The synchronous voltage follower advantageously generates a continuous signal which is characteristic of the current in the inductive load, even if the semiconductor switch in question is controlled (switched on and off) in a pulse-width-modulated manner. In particular, the voltage signal generated by the synchronous voltage follower can be proportional to the current in the inductive load. Since the current measurement in accordance with the invention is based on a measurement and processing of the voltage drop at (at least) one semiconductor switch, there are no losses as when using a specific measurement resistor.

Since the apparatus according to the invention is provided for use in connection with a PWM-controlled half-bridge circuit, the monitoring device of the apparatus may have, for example, an input to which a PWM control signal, which is required anyway to control the half-bridge circuit, is fed.

As an alternative or in addition, the monitoring device can have an input to which a control signal is fed, said control signal being branched off from a control input (for example gate in an FET) of the semiconductor switch in question.

Finally, as an alternative or in addition to these possibilities, it is possible for the monitoring device to have an input to which a voltage signal is fed, said voltage signal being tapped from that connection of the inductive load that is connected to the semiconductor switch in question.

All of the aforementioned signals enable the monitoring device to determine the switched-on states and switched-off states of the at least one semiconductor switch.

In one embodiment, the monitoring device is implemented as a digital computer device, in particular for example a program-controlled digital computer device (for example a microcontroller), or represents a partial functionality of such a computer device.

The synchronous measurement amplifier can be implemented, for example, by way of an appropriately wired operational amplifier, for example wired with two resistors as a non-inverting amplifier or as an inverting amplifier.

The synchronous voltage follower can be implemented, for example, by way of an appropriately wired operational amplifier (negative feedback operational amplifier).

However, within the scope of the invention, the synchronous measurement amplifier and the synchronous voltage follower must be able to be operated synchronously with the switching-on and switching-off processes of the semiconductor switch in question. For this purpose, these components can be provided with a corresponding control input in order to be able to enter or apply a corresponding control signal based on the monitoring device, which control signal, for example, switches on both the measurement amplifier and the voltage follower in the switched-on state of the semiconductor switch and switches off these two components again in the switched-off state of the semiconductor switch.

To achieve switching on and off that is as distortion-free as possible, the synchronous measurement amplifier can particularly advantageously be designed, for example, as a so-called transconductance amplifier (voltage-controlled current source) or contain same. For example, this can prevent disadvantageous overshoots during transient processes of control loops provided in the measurement amplifier and thus minimize the resulting errors.

In one embodiment, the synchronous voltage follower is designed to keep the voltage signal substantially constant during the switched-off state of the semiconductor switch.

In one embodiment, this is implemented using a capacitor, which is arranged at an output of the voltage follower in order to thus keep the voltage signal generated by the voltage follower constant, as mentioned above. The constant voltage signal then corresponds to that voltage follower output signal that was present at the end of the previous phase in which the semiconductor switch in question was switched on.

In another embodiment, the synchronous voltage follower is designed to decrease the voltage signal in accordance with a predefined profile during the switched-off state of the semiconductor switch.

This can also be done, for example, using a capacitor, which is arranged at an output of the voltage follower, wherein, in addition, a device for the predefined discharge of the capacitor is to be provided during the switched-off state. In the simplest case, such a discharge device can be formed by a passive (for example ohmic) resistor parallel to the capacitor. In another embodiment, the discharge takes place via a controllable current source arranged parallel to the capacitor and controlled by the monitoring unit.

In one development, the predefined profile during the switched-off state of the semiconductor switch approximates an expected current reduction in the inductive load and/or the predefined profile is designed to be configurable and can be defined via a programming interface.

This can advantageously improve the accuracy of the current measurement.

The aforementioned programming interface can be provided on a program-controlled computer device, which forms or at least contains the monitoring device.

In a particularly advantageous embodiment or use of the invention, provision is made for the inductive load to be formed by an electric motor, in particular for example by a DC motor.

In this case in particular, the monitoring device, possibly also the synchronous measurement amplifier and the synchronous voltage follower, can advantageously be combined together with a PWM motor control device in an integrated circuit.

One embodiment involves an electric motor in a vehicle, such as for example a motor for activating adjustable vehicle components, for example for adjusting a vehicle seat or components thereof or for adjusting a closure element of the vehicle (for example window, sunroof cover, hood, etc.). As an alternative, the motor in the vehicle can be provided, for example, for driving a fluid pump.

In one embodiment, the apparatus further has a temperature detection device for detecting a temperature of the semiconductor switch and an evaluation device, which determines the current flowing through the inductive load based on the voltage signal (generated by the voltage follower) and the detected temperature of the semiconductor switch.

In particular, provision can be made here for the result of the temperature detection to be used to determine a resistance of the semiconductor switch in question in the switched-on state (for example using a stored look-up table or the like in order to assign a corresponding resistance to a measured temperature). A temperature-dependent correction of the switch-on resistance advantageously enables a reduction in the systematic measurement errors otherwise resulting from the temperature dependency.

An improvement in the measurement accuracy can likewise be achieved if the absolute errors of the arrangement (for example with regard to the switch-on resistance of the semiconductor switch, offset and gain of the signal processing arrangement consisting of a synchronous measurement amplifier and synchronous voltage follower) are calibrated and used to correct a determined current value. Correction parameters suitable for this (and possibly detected depending on temperature) can, for example, be stored, in the monitoring device and used during operation of the apparatus for the purpose of a (more precise) evaluation of the voltage signal generated by the voltage follower (possibly also taking into account the measured temperature).

In one embodiment, the apparatus further has a comparison device for comparing the measured current flowing through the inductive load with a prescribed threshold value and an evaluation device, which generates an overload signal indicating an exceedance if the threshold value is exceeded.

The comparison device can be formed, for example, by a voltage comparator to which on the one hand the voltage signal generated by the voltage follower and on the other hand a predetermined (for example fixed or for example defined by the evaluation device) reference voltage is input.

The evaluation device can be formed, for example, by one or the above-mentioned digital, in particular for example program-controlled, digital computer device, which also in particular can form the monitoring device, for example.

"Short-circuit monitoring" can advantageously be implemented using this embodiment.

In one embodiment, the half-bridge circuit has a plurality of half-bridges each having two semiconductor switches and the apparatus further has a controllable selection device by means of which one of the plurality of semiconductor switches can be selected for measuring the current flowing through the inductive load.

In accordance with a first variant of this embodiment, the apparatus comprises a synchronous measurement amplifier and a synchronous voltage follower arranged downstream of this (as already described), wherein, by means of the selection device, an input of the synchronous measurement amplifier can be variably connected to various ones of the semiconductor switches in order during the switched-on state of the selected semiconductor switch to measure and to multiply the voltage drop at said semiconductor switch and to feed it to an input of the synchronous voltage follower arranged downstream.

According to a second variant of this embodiment, the apparatus comprises a respective arrangement (connected to the respective semiconductor switch) of a synchronous measurement amplifier and a synchronous voltage follower arranged downstream for various ones of the semiconductor switches, wherein one of the plurality of voltage followers or the output thereof is variably selected by means of the selection device at the output of which the voltage signal that is characteristic of the current in the inductive load is tapped and reused (for example for further evaluation).

In both variants, the selection device can be formed or controlled, for example, by a or the aforementioned digital computer device. In the case of use of motor control, the computer device can be connected, for example, via a digital bus system to a "motor management" device (for example a microcontroller) (likewise designed as a computer device). This makes it possible, for example, for specifications of the motor management to be transmitted to the selection device.

According to a further aspect of the present invention, an integrated circuit is proposed for controlling a half-bridge circuit used to energize an inductive load (for example electric DC motor) and for measuring the current flowing through the inductive load, wherein the half-bridge circuit has at least one first half-bridge having two first semiconductor switches and a second half-bridge having two second semiconductor switches, and wherein the integrated circuit has:
  a PWM control device for switching the semiconductor switches of the half-bridge circuit on and off in a complementary manner in accordance with a PWM method (for example based on a supplied PWM control signal),
  a first apparatus as claimed in one of the preceding claims, which is connected to at least one of the two first semiconductor switches,
  a second apparatus as claimed in one of the preceding claims, which is connected to at least one of the two second semiconductor switches, and
  a control device, by means of which the first or the second apparatus can be selected for the measurement of the current flowing through the inductive load.

In very general terms, within the scope of the invention, the term "half-bridge circuit" denotes a circuit that has one or more half-bridges. The term "half-bridge" here denotes a series connection of two controllable semiconductor switches such as in particular for example FETs (field-effect transistors), such as for example MOSFETs, wherein in situations of use this series circuit is connected to a supply voltage and one connection of the inductive load is connected to a tap between the two semiconductor switches ("center tap").

The aforementioned integrated circuit can be provided, for example, to control a (single) electric motor and in this case to control a (single) half-bridge, the center tap of which is connected to one connection of the motor, whereas the other connection of the motor is connected, for example, to a fixed electrical potential (for example electrical ground or electrical supply potential).

As an alternative, to control a (single) motor, for example, a half-bridge circuit having two half-bridges can also be used, the center taps of which (between the respective semiconductor switches) are connected to one of the two connections of the motor.

In one development, the aforementioned integrated circuit is provided for controlling a plurality of inductive loads, in particular for example a plurality of electric motors and in this case has a suitable plurality of half-bridges.

By way of example, a first, second and third half-bridge can be used to control a first and a second motor, wherein the first motor is connected to the center taps of the first and second half-bridges and the second motor is connected to the center taps of the second and third half-bridges.

As an alternative, for example, the first motor could be connected to the center taps of the first and second half-bridges and the second motor can be connected to the center taps of the first and third half-bridges.

According to these principles, integrated circuits can be designed to control "n" motors, where n denotes the number of motors to be controlled, wherein the half-bridge circuit used here may then have a total of "n+1" half-bridges, for example, that are controlled by the integrated circuit.

In accordance with a further aspect of the present invention, a method is proposed for measuring an electric current flowing through an inductive load (for example an electric motor) that is energized by means of a half-bridge circuit having at least two semiconductor switches, wherein the semiconductor switches are switched on and off in a complementary manner in accordance with a PWM method, wherein the method comprises the following steps:
  monitoring at least one of the at least two semiconductor switches in order to determine the switched-on states and switched-off states of the at least one of the at least two semiconductor switches,
  measuring a voltage drop present at the semiconductor switch during the determined switched-on state of the semiconductor switch,
  synchronously multiplying the voltage drop measured at the semiconductor switch during the determined switched-on state of the semiconductor switch so as to form a multiplied voltage, and
  generating a voltage signal which is characteristic of the current in the inductive load and which in the switched-on state of the semiconductor switch follows the multiplied voltage and in the switched-off state of the semiconductor switch is kept substantially constant or is decreased in accordance with a predefined profile.

A preferred use within the scope of the invention of such a method or the apparatus described here is the measurement of the current flowing through an electric motor, in particular for example a DC motor, which is used in a vehicle for controllable operation (for example adjustment) of a vehicle component (as already described above).

An advantageous use of the integrated circuit according to the invention is the energization of a plurality of electric motors, in particular DC motors, and the measurement of a respective motor current (of a presently energized motor), for example in a vehicle for controllable operation (for example adjustment) of a plurality of vehicle components.

The embodiments and special configurations described here for the apparatus according to the invention or the integrated circuit according to the invention (and/or features of the half-bridge circuit described in this context) can also be provided, individually or in any combination, in an analogous manner as embodiments or special configurations of the method according to the invention (or a use according to the invention), and vice versa.

In one embodiment of the method, provision is made, for example, for the voltage signal to be generated by means of a synchronous voltage follower. For this purpose, a voltage follower of the type already described further above can be used in the method.

In one embodiment, provision is made for an electrical resistance of the semiconductor switch to be temperature-dependent, and for the method to further comprise the following steps:
  detecting a temperature of the semiconductor switch, and
  determining the current flowing through the inductive load based on the voltage signal and the detected temperature of the semiconductor switch.

A temperature sensor specifically arranged on the relevant semiconductor switch can be used to detect the temperature. As an alternative or in addition, provision can be made for the use of a semiconductor switch which already has a temperature sensor and a corresponding signal output for providing a signal that is characteristic of the temperature.

Provided that the characteristic voltage signal generated anyway is not simply used as such, the current can be determined, in particular, for example, in a program-controlled manner (for example also taking into account a measured temperature and/or correction parameters of the aforementioned type).

In one embodiment, provision is made for the method to further comprise the following steps:
  comparing the measured current flowing through the inductive load with a prescribed threshold value, and
  generating an overload signal indicating that the threshold value has been exceeded if the measured current exceeds the threshold value.

Particularly in the event that a variable threshold value instead of a fixedly prescribed threshold value is provided, the comparison of the current with the threshold value can involve the threshold value being defined beforehand in a program-controlled manner.

The overload signal can also be generated as required, for example, in a program-controlled manner.

In one embodiment, provision is made for the voltage signal to be decreased in accordance with a predefined profile in the switched-off state of the semiconductor switch.

For this purpose, a capacitor, to which the characteristic voltage signal generated is applied during the switched-on state of the semiconductor switch in question, is preferably used in conjunction with a current source arranged in parallel with the capacitor for discharging said capacitor. In the simplest case, the current source can be formed by an ohmic resistor, which provides a discharge current proportional to the present charging voltage of the capacitor. As an alternative, for example, a controllable power source can be used to discharge the capacitor.

In one embodiment, provision is made for the predefined profile during the switched-off state of the semiconductor switch to approximate an expected current reduction in the inductive load and/or for the predefined profile to be designed to be configurable and to be able to be defined via a programming interface.

For this purpose, for example, the capacitance value and the resistance value of the above-mentioned parallel arrangement of a capacitor and a resistor can be measured appropriately, that is to say in line with the expected time profile of the current reduction in the inductive load during the switched-off state, or a current source arranged parallel to the capacitor can be controlled appropriately.

In one embodiment, provision is made for the inductive load to be formed by an electric motor, in particular a DC motor.

If in a specific application a reversal of the direction of rotation of the DC motor is not required, the motor can be energized, for example, by means of a half-bridge circuit having only one half-bridge having two semiconductor switches that are switched on and off in a complementary manner. In this case, the connection of the motor that is not connected to the half-bridge can be connected, for example, to a fixed electrical potential (for example electrical ground or electrical supply potential). As an alternative, however, a half-bridge circuit having two half-bridges each having two semiconductor switches could also be used in this application.

In one embodiment, provision is made for the half-bridge circuit to have a plurality of half-bridges in each case having two semiconductor switches and for the method to further comprise the following step: selecting one of a plurality of semiconductor switches for measuring the current flowing through the inductive load.

In accordance with a first variant, the semiconductor switch is selected in that this semiconductor switch is connected to a device used to measure the voltage drop and to further process the measurement signal, whereas, in accordance with a second variant, the semiconductor switch is selected in that a device is selected from multiply provided such measurement and processing devices (corresponding to the plurality of selectable semiconductor switches), the provided voltage signal (characteristic of the current in the inductive load) of said device then being used or (possibly after an evaluation) drawn on for the current measurement.

In an advantageous design of the invention, the apparatus is integrated in an integrated motor control module, using which the current of an electric motor can be detected for various operating conditions of the motor.

Figure 2:
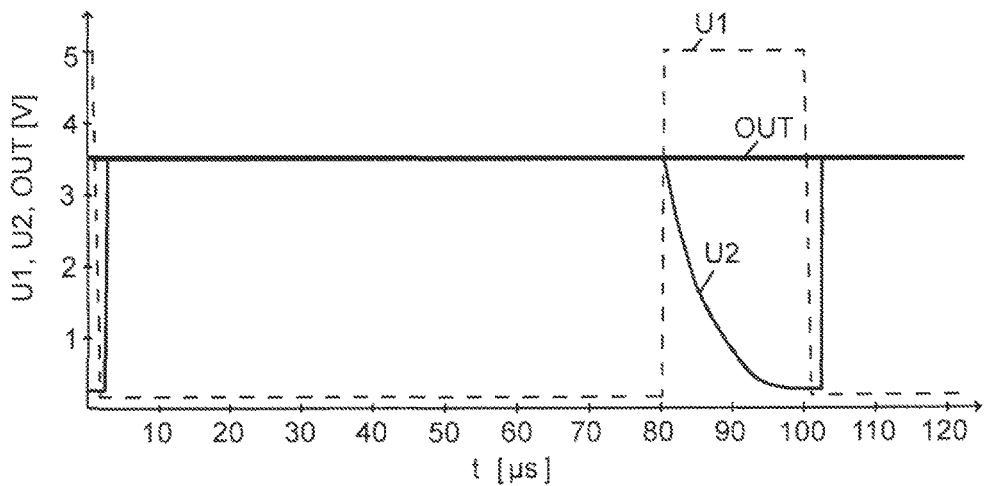
Figure 3:
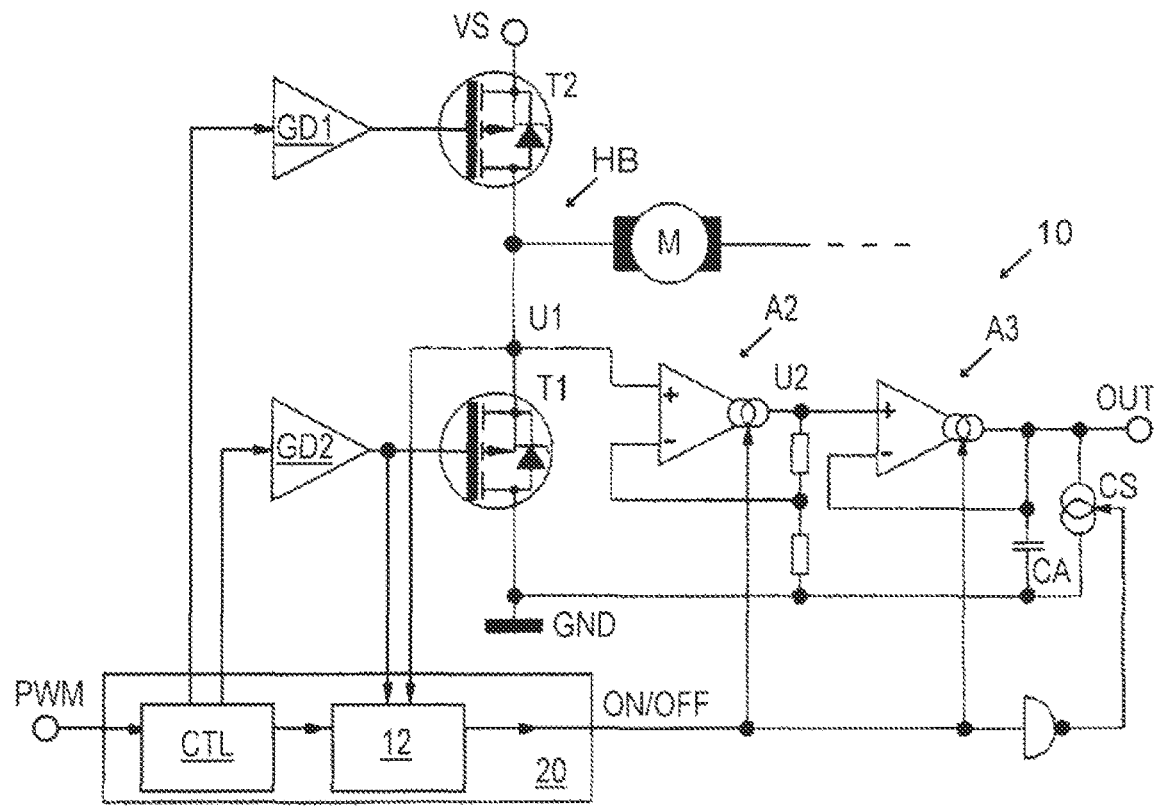
Figure 4:
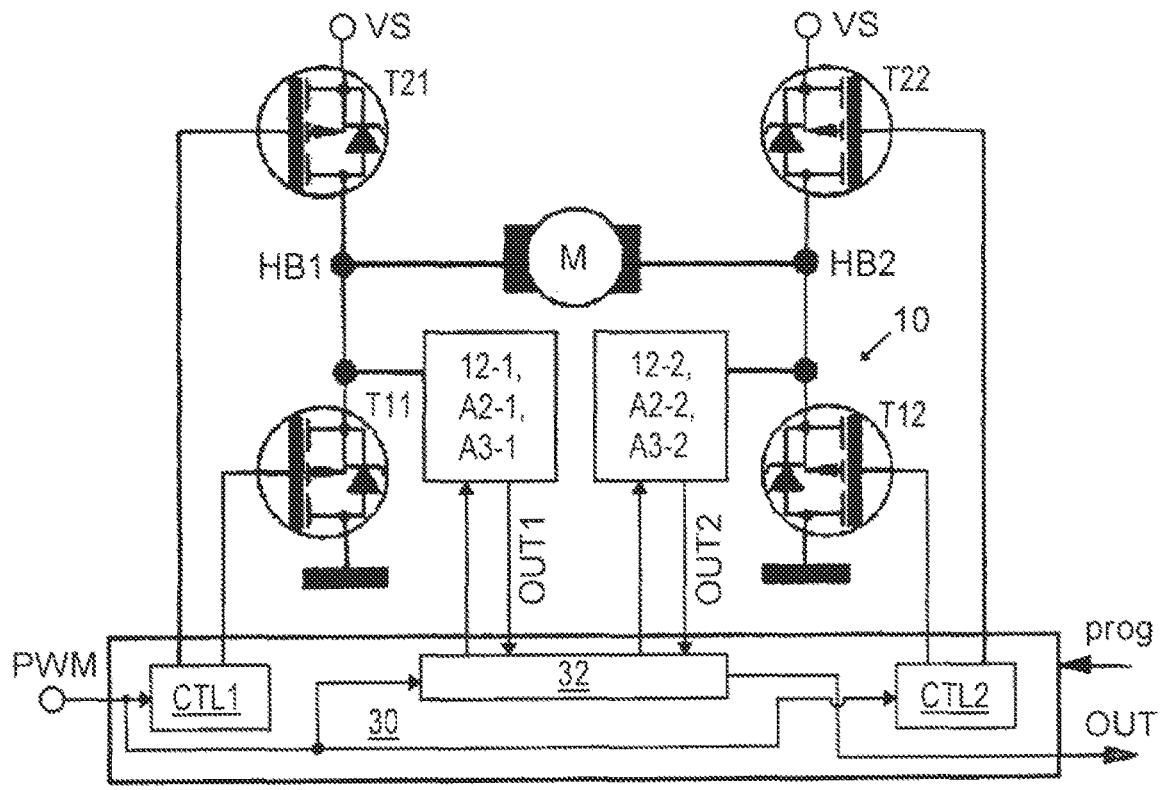

The invention is described in more detail below on the basis of exemplary embodiments with reference to the accompanying drawings, in which:

FIG. 1 is a basic circuit diagram of a circuit arrangement for controlling an electric motor, equipped with an apparatus for measuring the current flowing through the motor, in accordance with an exemplary embodiment, FIG. 2 shows, by way of example, time profiles of various electrical voltages that arise during operation of the apparatus from FIG. 1, FIG. 3 is a basic circuit diagram of a circuit arrangement having a current measurement apparatus in accordance with a modified exemplary embodiment, and FIG. 4 is a basic circuit diagram of a circuit arrangement for controlling an electric motor, equipped with an apparatus for measuring the current flowing through the motor, in accordance with a further exemplary embodiment.

FIG. 1 shows a circuit arrangement for PWM (pulse-width modulation) control of an electric motor M (generally: inductive load, in this case: DC motor) together with an apparatus 10 for measuring the electric current flowing through the motor M.

In the example illustrated, the motor M is energized by means of a half-bridge circuit, which comprises (at least)

one half-bridge HB formed from a series circuit of two controllable semiconductor switches T1 and T2.

In the example illustrated, the two switches T1 and T2 are each designed as MOSFETs. In a departure from this, however, other embodiments of semiconductor switches come into consideration, such as are known, in particular, for example, as "circuit breakers" from the prior art of half-bridges for controlling electric machines.

In FIG. 1, the half-bridge circuit is connected on the one hand to an electrical supply potential VS and on the other hand to an electrical ground GND.

One of the two connections of the motor M (on the left in FIG. 1) is connected to a center tap of the half-bridge HB (between T1 and T2) and the other of the two connections of the motor M (on the right in FIG. 1) is connected, for example, to a fixed electrical potential, such as, for example, the supply potential VS.

In a departure from this, the latter connection of the motor M could also be connected, in particular, for example, to the center tap of a further half-bridge of the type illustrated (cf. also the example of FIG. 4 in this regard).

The PWM control of the motor M takes place via the two switches T1 and T2, which are controlled via respective gate drivers GS1 and GD2 in a complementary manner based on a PWM control signal "PWM".

The signal PWM may be, for example, an analog or a digital signal (for example data signal) and defines a desired PWM duty cycle for the motor control. The signal PWM is fed to a PWM control device CTL, which uses it to generate complementary control signals for controlling the gate drivers GD1, GD2, which in turn generate the control potentials for the gates (generally: control connections) of the switches T1, T2, said control potentials being suitable for the low-loss switching on and off of the switches T1, T2 in a complementary manner.

The electrical potential at the center tap of the half-bridge HB is denoted by U1 in FIG. 1. In accordance with the PWM control of the half-bridge HB, U1 changes back and forth between the potentials GND and VS when the circuit arrangement is in operation.

A PWM period of the PWM control which is advantageous within the scope of the invention may be in the range of from 1 ms to 10 μs, for example.

In accordance with the exemplary embodiment illustrated, the current measurement apparatus 10 has the following components:
  a monitoring device 12, which is designed to determine the switched-on states and switched-off states of the switches (in this case: MOSFETs) T1 and T2,
  a synchronous measurement amplifier A2, which is controlled by the monitoring device 12 and designed to measure a voltage drop present at the switch T1 during the determined switched-on state of said switch T1 (in this case: U1−GND) and to multiply it so as to form a multiplied voltage U2,
  a synchronous voltage follower A3, which is controlled by the monitoring device 12 and generates a voltage signal OUT which is characteristic of the motor current and which in the switched-on state of the switch T1 follows the multiplied voltage U2 and in the switched-off state of the switch T1 remains substantially constant.

In order to determine the current in the motor M, the voltage drop across the switch T1 in the switched-on phase is evaluated.

FIG. 2 shows an exemplary profile of the following voltages as a function of time t during a period of the PWM control (in this case for example 100 μs) when the apparatus 10 is in operation:
  U1: half-bridge voltage, at the center tap of the half-bridge HB,
  U2: multiplied voltage, at the output of the synchronous measurement amplifier A2, and
  OUT: characteristic voltage signal, at the output of the synchronous voltage follower A3.

The switched-on phase or the switched-on state of the switch T1 is determined in the monitoring device 12 by way of the PWM control signal PWM, which is also fed to the monitoring device 12 for this purpose, or, as symbolized in FIG. 1, is forwarded to the monitoring device 12 by the PWM control device CTL.

As an alternative or in addition, the monitoring device 12, as is also illustrated in FIG. 1, can tap relevant signals directly at the switch T1, such as the potential at the gate (in general: control input) of the switch T1 and/or the half-bridge potential U1.

In the switched-on state of the switch T1, the synchronous measurement amplifier A2 and the synchronous voltage follower A3 are switched on by means of a synchronization signal "ON/OFF" generated by the monitoring device 12 and the voltage drop at the switch T1, corresponding to the half-bridge potential U1, is multiplied so as to form the multiplied voltage U2 and output via the synchronous voltage follower A3 as the characteristic voltage signal OUT.

In the switched-off state of the switch T1, the synchronous measurement amplifier A2 and the synchronous voltage follower A3 are switched off. A capacitor CA at the output of the synchronous voltage follower A3 then holds the state (voltage signal OUT) constant until the switch T1 is next in the switched-on state.

One advantage of the apparatus 10 is that a continuous output signal (OUT) is provided at its output, which output signal in the example is proportional to a (peak) current in the inductive load (in this case: motor M) owing to the illustrated configuration of the measurement amplifier A2, even if the semiconductor switch in question (in this case: switch T1) is controlled with pulse width modulation.

In order to achieve switching on and off that is as distortion-free as possible, the synchronous measurement amplifier A2 is designed as a transconductance amplifier (having a voltage input and a current output).

The output voltage of the apparatus 10, that is to say the characteristic voltage signal OUT, is in this example proportional to the peak current in the switched-on state of the switch T1 (Ohm's law) and is continuously available.

In the example illustrated, the PWM control device CTL and the monitoring device 12 are structurally combined in a control and monitoring device 20, which can be implemented, for example, as an integrated circuit.

Notwithstanding the illustration in FIG. 1, in such an integrated circuit, for example, the gate drivers GD1, GD2 and/or the measurement amplifier A2 and/or the voltage follower A3 can additionally be integrated.

In other words, the apparatus 10 can thus advantageously be integrated at least partially, or else completely, into a control module of half-bridge drivers. As a result thereof, the current in the inductive load can be measured in the control module with minimal additional effort in practice and, in the application of the motor control, can be made available for motor management, for example.

Although in the example of FIG. 1 the motor current is measured via the "low-side" MOSFET T1, the apparatus 10 could also, however, deviating from this, be adapted for a measurement in the "high-side" path, that is to say for measuring and further processing the voltage drop at the switch T2. To this end, for example, analog "level shifters" could be provided to supply the necessary control signals and to decouple the output signal (OUT) and, for example, could be integrated into the control and monitoring device 20.

In the following description of further exemplary embodiments, the same reference signs are used for components with the same effect. In this case, essentially only the differences from the exemplary embodiment(s) already described are discussed here and otherwise express reference is made to the description of previous exemplary embodiments.

FIG. 3 shows a circuit arrangement in which a current measurement apparatus 10 is slightly modified compared to the current measurement apparatus in FIG. 1.

In the exemplary embodiment of FIG. 3, in the switched-off state of the switch (T1) in question, the current profile in the motor M (generally: inductive load) can be simulated by a controlled discharge of the output capacitor CA.

For this purpose, the apparatus 10 additionally has a controllable current source CS for the controllable discharging of the capacitor CA during the switched-off state. The current source CS can in this case, as illustrated in FIG. 3, be controlled by the monitoring device 12 using the synchronization signal ON/OFF (or its inverted variant) which is provided anyway.

The output signal of the apparatus 10, that is to say the characteristic voltage signal OUT, can thus advantageously be provided, for example, proportionally to an average current in the inductive load.

FIG. 4 shows an exemplary embodiment in which a motor M is energized by means of a PWM-controlled half-bridge circuit comprising two half-bridges HB1 and HB2, each having two switches T11, T21 and T12, T22, respectively.

In this example, the motor M is arranged in a bridge branch of the two half-bridges HB1 and HB2, so that more varied PWM strategies are made possible due to the controllability of the total of four switches T11, T21, T12, T22.

Corresponding to the number of two half-bridges HB1, HB2, two PWM control devices CTL1 and CTL2 are provided for the PWM control of the motor M in this example, to which control devices a PWM control signal PWM is fed in order to generate the control signals required for switching the respectively associated switches T11, T21 and T12, T22, respectively, and to apply said control signals to the control inputs (gates).

An apparatus 10 for measuring the current flowing through the motor M in this example comprises two current measurement apparatuses 12-1, A2-1, A3-1 and 12-2, A2-2, A3-2 of the type already described with reference to FIGS. 1 to 3 (corresponding to the arrangement "12, A2, A3"), which, as illustrated in FIG. 4, are assigned to the respective low-side switch T11 or T12 of the half-bridges HB1 and HB2.

The apparatus 10 furthermore comprises a selection and evaluation device 32.

In the example, on the one hand the operation of the two current measurement apparatuses 12-1, A2-1, A3-1 and 12-2, A2-2, A3-2 can be controlled by means of a selection and evaluation device 32. For this purpose, as symbolized in FIG. 4, for example the PWM control signal PWM can also be fed to the two current measurement apparatuses or the monitoring devices 12-1 and 12-2 included therein via the selection and evaluation device 32, which current measurement apparatuses synchronize, that is to say for example switch on and off at the same time, the respectively assigned arrangement of synchronous measurement amplifier A2-1 or A2-2 and synchronous voltage follower A3-1 or A3-2 in the manner already described.

In a departure from this, however, as already described, the monitoring devices 12-1 and 12-2 could also draw on relevant signals tapped directly at the switches T11 and T12 for monitoring the switching states.

By means of the selection and evaluation device 32, one of the output signals OUT1, OUT2 provided by the two current measurement apparatuses 12-1, A2-1, A3-1 and 12-2, A2-2, A3-2 is also optionally selected and provided at an output of the apparatus 10 as an output signal OUT.

In this exemplary embodiment, one of the two switches T11 and T12 can therefore advantageously be selected for measuring the current flowing through the motor M.

This selection can be controlled, for example, depending on a corresponding specification of a device (not shown) for "motor management", wherein such a motor management device can also generate the signal PWM required for PWM control, for example.

In the illustrated example of FIG. 4, the mentioned specification of the motor management can be transmitted to a control module 30 as a programming signal "grog" via a programming device (for example digital interface), which control module contains the PWM control devices CTL1, CTL2 and the selection and evaluation device 32 and, in a departure from the illustration in FIG. 4, can also additionally contain the current measurement apparatuses 12-1, A2-1, A3-1 and 12-2, A2-2, A3-2.

By means of the programming signal "grog" that is fed, for example, via a digital bus system and the selection and evaluation device 32, which functions like a multiplex device, one of the available switches (in this case: T11 and T12) can be selected for the current measurement and the result of the selected current measurement (in this case: signal OUT) can be transmitted to a higher-level control device such as, in particular, to the aforementioned motor management device, for example. A particularly flexible motor management can advantageously be achieved through the programmable selection of different current measurement apparatuses.

In general, it is advantageous if at least one current measurement apparatus, or, as illustrated in FIG. 4, a plurality of (in this case: two) current measurement apparatuses, are integrated into one module (in this case: control module 30), which also contains the devices (in this case: CTL1, CTL2) provided for controlling the switches in question (in this case: T11, T21, T12, T22).

Such a module, such as the illustrated control module 30, for example, can advantageously be implemented as an integrated circuit for controlling a half-bridge circuit used to energize an inductive load and for measuring the current flowing through the inductive load. The half-bridge circuit can in this case in particular have at least one first half-bridge having two first semiconductor switches and a second half-bridge having two second semiconductor switches, as shown in FIG. 4, for example.

In order to reduce a measurement error of the current measurement apparatus 10 of FIGS. 1 and 3 or of the two current measurement apparatuses of FIG. 4, all of the exemplary embodiments described above take into consideration measuring a temperature of the switch or switches in question (used for current measurement) in order to determine a (temperature-dependent) switch-on resistance of such switches or to correct said switch-on resistance in a manner depending on temperature.

In the context of the invention, the signal OUT or for example one of a plurality of such signals (for example OIUT1, OUT2 in FIG. 4) is then expediently not directly used as "determination variable" of the current measurement but this determination variable is formed only through evaluation of the signal OUT while also taking into account the measured temperature. In the examples, the evaluation can be carried out, for example, in the (appropriately designed) control and monitoring device 20 (FIGS. 1 and 3) or in the control module 30 (FIG. 4). In FIG. 4, for example, temperature measurement signals tapped by the switches T11, T12 could be fed to the control module 30 for this purpose in order to further process the respectively selected signal OUT1 or OUT2 first depending on the measured temperature in order then to output said signal as a "temperature-corrected" signal OUT.

In particular, the invention is used to provide an apparatus and a method by means of which a motor current flowing through any semiconductor switch, in particular a standard power switch such as a FET or MOSFET or the like, can be measured as part of a PWM motor control implemented by means of a half-bridge circuit. A continuous measurement signal can advantageously be provided here. The measurement itself does not cause any additional losses in the power circuit. Measurement electronics can advantageously be integrated into the control module of a PWM motor control.

The invention claimed is:

1. An apparatus for measuring an electric current flowing through an inductive load which is energized by a half-bridge circuit having at least two semiconductor switches, wherein the semiconductor switches are switched on and off in a complementary manner in accordance with a PWM method, the apparatus comprising:
   a monitoring device configured to determine switched-on states and switched-off states of at least one of the at least two semiconductor switches,
   a synchronous measurement amplifier, which is controlled by the monitoring device and configured to measure a voltage drop present at the semiconductor switch during the determined switched-on state of the semiconductor switch and to multiply it so as to form a multiplied voltage, a synchronous voltage follower, which is controlled by the monitoring device and generates a voltage signal which is characteristic of the current in the inductive load and which in the switched-on state of the semiconductor switch follows the multiplied voltage and in the switched-off state of the semiconductor switch remains substantially constant or decreases in accordance with a predefined profile,
   wherein the half-bridge circuit comprises a plurality of half-bridges each having two semiconductor switches; and
   a controllable selection device by which one of the at least two semiconductor switches can be selected for measuring the current flowing through the inductive load.

2. The apparatus as claimed in claim 1, wherein the synchronous voltage follower is configured to keep the voltage signal substantially constant during the switched-off state of the semiconductor switch.

3. The apparatus as claimed in claim 1, wherein the synchronous voltage follower is configured to decrease the voltage signal in accordance with a predefined profile during the switched-off state of the semiconductor switch.

4. The apparatus as claimed in claim 3, wherein at least one of the predefined profile during the switched-off state of the semiconductor switch approximates an expected current reduction in the inductive load and the predefined profile is configurable and can be defined via a programming interface.

5. The apparatus as claimed in claim 1, wherein the inductive load is formed by an electric DC motor.

6. The apparatus as claimed in claim 1, further comprising a temperature detection device configured to detect a temperature of the semiconductor switch and an evaluation device, which determines the current flowing through the inductive load based on the voltage signal and on the detected temperature of the semiconductor switch.

7. The apparatus as claimed in claim 1, further comprising a comparison device configured to compare the measured current flowing through the inductive load with a prescribed threshold value and comprising an evaluation device, which if the threshold value is exceeded generates an overload signal indicating this exceedance.

8. An integrated circuit for controlling a half-bridge circuit used to energize an inductive load and for measuring the current flowing through the inductive load, wherein the half-bridge circuit comprises at least one first half-bridge having two first semiconductor switches and a second half-bridge having two second semiconductor switches, the integrated circuit comprising:
   a PWM control device for switching the semiconductor switches of the half-bridge circuit on and off in a complementary manner in accordance with a PWM method;
   a first and a second apparatus for measuring an electric current flowing through an inductive load which is energized by a half-bridge circuit having at least two semiconductor switches, wherein the semiconductor switches are switched on and off in a complementary manner in accordance with a PWM method, each apparatus comprising:
      a monitoring device configured to determine switched-on states and switched-off states of at least one of the at least two semiconductor switches,
      a synchronous measurement amplifier, which is controlled by the monitoring device and configured to measure a voltage drop present at the semiconductor switch during the determined switched-on state of the semiconductor switch and to multiply it so as to form a multiplied voltage,
      a synchronous voltage follower, which is controlled by the monitoring device and generates a voltage signal which is characteristic of the current in the inductive load and which in the switched-on state of the semiconductor switch follows the multiplied voltage and in the switched-off state of the semiconductor switch remains substantially constant or decreases in accordance with a predefined profile;
   the first apparatus connected to at least one of the two first semiconductor switches,
   the second apparatus connected to at least one of the two second semiconductor switches, and
   a control device, by which the first or the second apparatus can be selected for measuring the current flowing through the inductive load.

9. A method for measuring an electric current flowing through an inductive load which is energized by a half-bridge circuit having at least two semiconductor switches, wherein the semiconductor switches are switched on and off in a complementary manner in accordance with a PWM method, the method comprising:

monitoring at least one of the at least two semiconductor switches and determining switched-on states and switched-off states of the at least one of the at least two semiconductor switches, measuring a voltage drop present at the semiconductor switch during the determined switched-on state of the semiconductor switch, synchronously multiplying the voltage drop measured at the semiconductor switch during the determined switched-on state of the semiconductor switch and forming a multiplied voltage, generating a voltage signal which is characteristic of the current in the inductive load and which in the switched-on state of the semiconductor switch follows the multiplied voltage and in the switched-off state of the semiconductor switch is kept substantially constant or is decreased in accordance with a predefined profile, wherein the half-bridge circuit comprises a plurality of half-bridges each comprising two semiconductor switches, and selecting one of a plurality of semiconductor switches for measuring the current flowing through the inductive load.

10. The method as claimed in claim 9, wherein the voltage signal is generated by a synchronous voltage follower.

11. The method as claimed in claim 9, wherein an electrical resistance of the semiconductor switch is temperature-dependent, the method further comprising:
detecting a temperature of the semiconductor switch,
determining the current flowing through the inductive load based on the voltage signal and the detected temperature of the semiconductor switch.

12. The method as claimed in claim 9 further comprising:
comparing the measured current flowing through the inductive load with a prescribed threshold value,
generating an overload signal indicating that the threshold value has been exceeded if the measured current exceeds the threshold value.

13. The method as claimed in claim 9, wherein the voltage signal is decreased in accordance with a predefined profile in the switched-off state of the semiconductor switch.

14. The method as claimed in claim 13, wherein the predefined profile during the switched-off state of the semiconductor switch approximates an expected current reduction in the inductive load and/or wherein the predefined profile is configurable and can be defined via a programming interface.

15. The method as claimed in claim 9, wherein the inductive load is formed by an electric DC motor.

* * * * *